United States Patent
Peng et al.

(10) Patent No.: US 9,536,876 B2
(45) Date of Patent: Jan. 3, 2017

(54) TEMPERATURE DETECTOR AND CONTROLLING HEAT

(71) Applicant: TAIWAN SEMICONDUCTOR MANUFACTURING COMPANY LTD., Hsinchu (TW)

(72) Inventors: Yung-Chow Peng, Hsinchu (TW); Amit Kundu, Hsinchu (TW); Szu-Lin Liu, Hsinchu (TW); Jaw-Juinn Horng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 678 days.

(21) Appl. No.: 13/956,838

(22) Filed: Aug. 1, 2013

(65) Prior Publication Data

US 2015/0035568 A1  Feb. 5, 2015

(51) Int. Cl.
| | |
|---|---|
| *G01K 7/01* | (2006.01) |
| *H01L 29/772* | (2006.01) |
| *H01L 29/78* | (2006.01) |
| *H01L 23/00* | (2006.01) |
| *H01L 27/088* | (2006.01) |
| *H01L 27/02* | (2006.01) |
| *H01L 23/34* | (2006.01) |
| *H01L 29/423* | (2006.01) |
| *H01L 29/786* | (2006.01) |

(52) U.S. Cl.
CPC ............ *H01L 27/088* (2013.01); *G01K 7/01* (2013.01); *H01L 23/34* (2013.01); *H01L 27/0251* (2013.01); *H01L 27/0886* (2013.01); *H01L 29/42392* (2013.01); *H01L 29/78696* (2013.01); *H01L 2924/0002* (2013.01)

(58) Field of Classification Search
CPC ................ H01L 2924/13091; H01L 23/5228; H01L 29/772; H01L 29/78; H01L 23/00; G01J 5/20; G01K 7/01; G01K 7/16
USPC .......................... 374/178; 257/288, 365, 467
See application file for complete search history.

(56) References Cited

U.S. PATENT DOCUMENTS

| | | | | | |
|---|---|---|---|---|---|
| 5,025,298 | A | * | 6/1991 | Fay ..................... | H01L 27/0248 257/355 |
| 5,063,307 | A | * | 11/1991 | Zommer ............. | H01L 27/0248 257/467 |
| 6,740,914 | B2 | * | 5/2004 | Masleid ................ | H01L 23/367 257/197 |
| 7,176,508 | B2 | * | 2/2007 | Joshi ....................... | H01L 22/34 257/253 |
| 7,391,082 | B2 | * | 6/2008 | Shin .................... | H01L 27/0629 257/351 |
| 9,006,087 | B2 | * | 4/2015 | Chang .............. | H01L 29/66477 257/347 |

(Continued)

*Primary Examiner* — Gail Kaplan Verbitsky
(74) *Attorney, Agent, or Firm* — WPAT, P.C., Intellectual Property Attorneys; Anthony King

(57) ABSTRACT

A circuit with a temperature detector includes a first FET and a second FET. Each of the first and second FETs has a channel structure having a non-planar structure. The second FET is in close proximity to the first FET. A gate of the second FET is separated from the first FET, and a source and drain of the second FET are shorted together. A resistance of the gate of the second FET between two terminals on the gate of the second FET varies with a temperature local to the first FET.

20 Claims, 11 Drawing Sheets

(56) References Cited

U.S. PATENT DOCUMENTS

| | | | |
|---|---|---|---|
| 9,012,965 B2* | 4/2015 | Luo | H01L 29/47 257/288 |
| 9,170,165 B2* | 10/2015 | Jayaraman | G01L 9/0042 |
| 2012/0068296 A1* | 3/2012 | Takaya | H01L 29/0873 257/467 |
| 2013/0294481 A1* | 11/2013 | Koyama | G01K 7/01 374/163 |
| 2014/0016669 A1* | 1/2014 | Chowdhury | G01K 7/01 374/178 |
| 2014/0086277 A1* | 3/2014 | Sanchez | G01K 1/026 374/178 |
| 2014/0112372 A1* | 4/2014 | Hoene | G01K 7/01 374/178 |
| 2014/0239381 A1* | 8/2014 | Tanno | H01L 29/7838 257/328 |
| 2014/0334522 A1* | 11/2014 | Meiser | G01K 7/01 374/178 |
| 2015/0098489 A1* | 4/2015 | Lee | G01K 7/01 374/178 |
| 2015/0268101 A1* | 9/2015 | Kumahara | G06F 1/325 374/178 |

* cited by examiner

TEMPERATURE DETECTOR AND CONTROLLING HEAT

TECHNICAL FIELD

The present disclosure is related to a temperature detector and controlling heat.

BACKGROUND

For planar semiconductor devices such as metal oxide field effect transistors (MOSFETs), heat generated from a passage of an electric current through semiconductor material is passed down to a substrate and dissipated. Therefore, a temperature detector, such as a diode or a bipolar junction transistor (BJT), is usually configured to detect a temperature of a chip, or a large area including many transistors. Such temperature detector is typically as large as 5–5 $\mu m^2$.

As process node advances, non-planar semiconductor devices such as fin field effect transistors (FinFETs) and nanowire field effect transistors (nanowire FETs) are being considered to replace the planar semiconductor devices to mitigate short channel effects, increase on-state currents, etc. Because of confined geometry of a non-planar device, heat generated when the device is operating is more difficult to be passed down to a substrate and dissipated, and therefore increases temperature at a particular location of the device, resulting in "local" self-heat. Local self-heat accelerates aging and reduces lifespan of the device. An increase of 10° C. to 15° C. in the device can result in about 2 times reduction in the lifespan of the device. Local self-heat also has a major impact on electromigration reliability of metal interconnects associated with the device that are thermally coupled to the heated location in the device. The mean time to failure of the circuit due to electromigration decreases as temperature of the metal interconnects increase.

Temperature detectors for planar devices are too large to detect a local temperature of a non-planar device.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Figure 1:
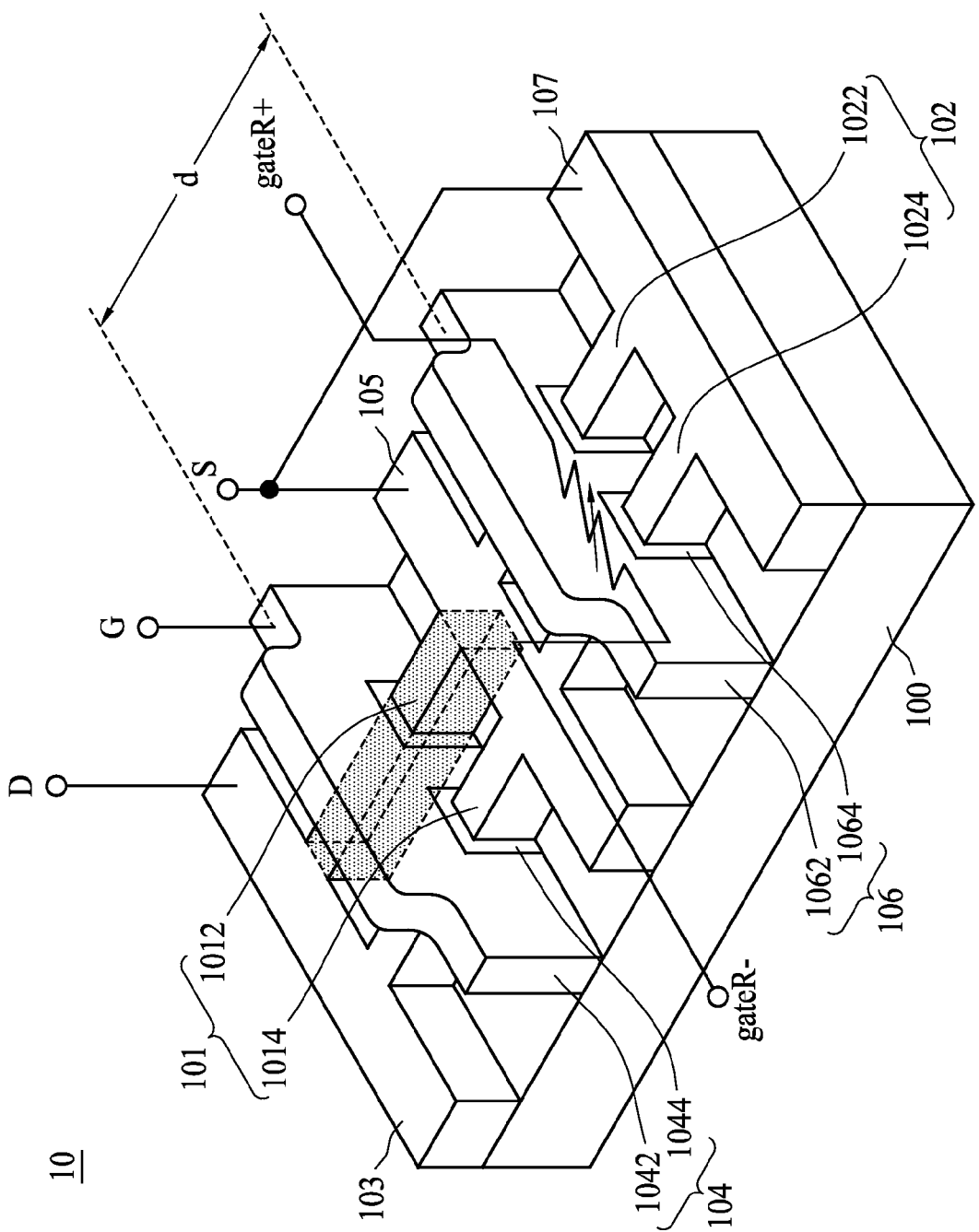
FIG. 1 is a schematic perspective diagram of a semiconductor device with a temperature detector in accordance with some embodiments.

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number. It will be understood that when an element is referred to as being "connected to" or "coupled to" another element, it may be directly connected to or coupled to the other element, or intervening elements may be present.

Semiconductor Device with Temperature Detector

FIG. 1 is a schematic perspective diagram of a semiconductor device 10 with a temperature detector in accordance with some embodiments. In an embodiment, the device 10 is a multi-finger FinFET with an unconnected gate finger serving as the temperature detector. In another embodiment, the device 10 includes two abutted FinFETs with a gate of one of the FinFETs that has shorted source and drain serving as the temperature detector for the other FinFET. The device 10 includes a substrate 100, channel structures 101 and 102, gate stacks 104 and 106, drain structures 103 and 107, and a source structure 105. The substrate 100 is a silicon-on-insulator (SOI) substrate or a bulk substrate. The channel structure 101 includes fins 1012 and 1014, and the channel structure 102 includes fins 1022 and 1024. For simplicity, each channel structure 102 or 104 includes two fins in FIG. 1. However, an implementation with other number of fins is also within the contemplated scope of the present disclosure. The fins 1012, 1014, 1022 and 1024 each have a rectangular periphery and are thus non-planar. The gate stack 104 includes a gate structure 1042 and a gate dielectric layer 1044. The gate stack 106 includes a gate structure 1062 and a gate dielectric layer 1064. In some other embodiments, the gate stack 106 does not include the gate dielectric layer 1064. The gate structures 1042 and 1062 are made of polysilicon, metal, or other suitable materials. The gate dielectric layers 1044 and 1064 are made of silicon oxide, silicon nitride, high-k dielectric material, or other suitable dielectric materials.

The gate stack 104 traverses the channel structure 101. As the gate stack 104 interfaces with the fin 1012 or 1014, the gate structure 1042 surrounds three of the four surfaces that form the rectangular periphery of the fin 1012 or 1014. The gate dielectric layer 1044 is inserted between the gate structure 1042 and the fin 1012 or 1014. In some other embodiments (not shown), as the gate stack interfaces with the fin, the gate stack surrounds the fin completely on the four surfaces that form the periphery of the fin. The channel structure 101 on opposite sides of the gate stack 104 is coupled to the drain structure 103 and the source structure 105. The gate stack 104, the channel structure 101, the drain and source structures 103 and 105 form a first FinFET. The first FinFET provides the transistor function for the device 10, and the gate structure 1042, and the drain and source structures 103 and 105 serve as a gate G, a drain D and a source S of the device 10, respectively.

Similarly, the gate stack 106 traverses the channel structure 102. The channel structure 102 on opposite sides of the gate stack 106 is coupled to the source structure 105 and the drain structure 107. The gate stack 106, the channel structure 102, the drain and source structures 107 and 105 form a second FinFET. In an embodiment, the first FinFET and the second FinFET are two FinFETs that are abutted. The source structure 105 is shared between the first FinFET and the second FinFET, or the source structures of the first and second FinFETs are coupled. In another embodiment, the device 10 is a multi-finger FET device. For a multi-finger FET device, the terminals of the first FinFET and the second FinFET are coupled. For example, the gate structure 1042 is coupled to the gate structure 1062 and the gate structures 1042 and 1062 are referred to as gate fingers of the multi-finger FET device. Further, the drain structure 103 is coupled to the drain structure 107, and the source structure 105 is shared. In some embodiments, to form a temperature detector from the second FinFET, the gate structure 1062 remains separated from the gate structure 1042, and the drain structure 107 and the source structure 105 are shorted together. The gate structure 1062 serves as the temperature detector for the first FinFET, has two resistance measuring terminals gateR+ and gateR−, has a resistance between the two resistance measuring terminals gateR+ and gateR−, and varies with temperature local to a particular area, such as the fin 1012 that is shaded. For simplicity, only one fin 1012 is shaded. However, the particular area also include the fin 1014. By measuring a resistance across the two terminals gateR+ and gateR−, the temperature local to the first FinFET is detected. Effectively, a temperature local to the device 10 is detected.

Local self-heat of the first FinFET is mainly generated in the channel structure 101 when the first FinFET is turned on, and the heat from the channel structure 101 is passed to the source structure 105 and the channel structure 102 to the gate structure 1062. In accordance with some embodiments, a distance d between the gate structure 1062 and the gate structure 1042 is smaller than about 0.5 μm. Because of the close proximity of the temperature detector and the channel structure 101 of the first FinFET, the temperature revealed by the temperature detector reveals the temperature of the channel structure 101. In addition, because the source structure 105 and the drain structure 107 on opposite side of the gate stack 106 are shorted, there is no current flowing in the channel structure 102, and no additional self-heat of the device 10 is introduced by the second FinFET.

In order to have more contact area with the channel structure 102 that receives heat passed from the channel structure 101, the temperature detector is arranged such that the two terminals gateR+ and gateR− are located across the channel structure 102. However, the present disclosure is not limited to such locations of the two terminals gateR+ and gateR−. For example, the two terminals gateR+ and gateR− are located across the fin 1022 or 1024, along the fin 1022 or 1024, or at any other locations on the gate structure 1062.

Figure 4:
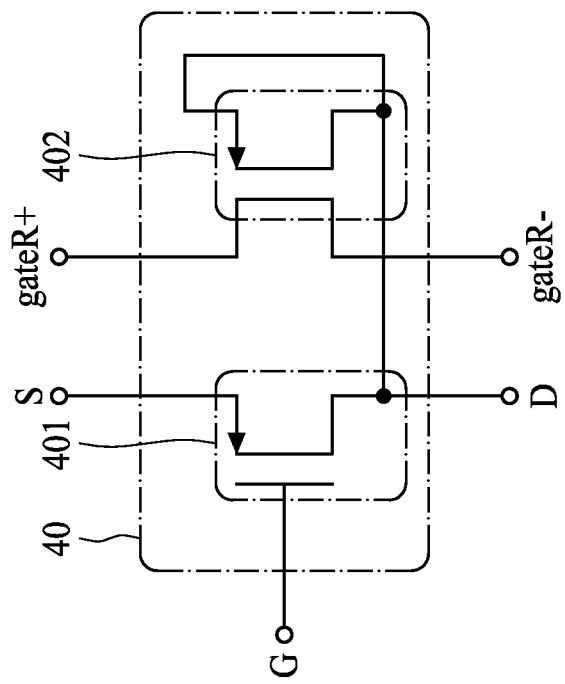
FIG. 4 is a schematic circuit diagram of a P channel semiconductor device with a temperature detector in accordance with some embodiments.

Further, in some embodiments with reference to FIG. 1, the device 10 is an N channel device, and the shorted drain and source structures 107 and 105 are coupled to the source S of the device 10 which typically receives a lower voltage than the drain D, so that the voltage of the shorted drain and source structures 107 and 105 is as close to ground as possible. In some other embodiments, the device is a P channel device, and the shorted drain and source structures and are coupled to the drain of the device which typically receives a lower voltage than the source, so that the voltage of the shorted drain and source structures is as close to ground as possible. The circuit diagram of the P channel device is shown in FIG. 4.

In accordance with some embodiments, the gate structure 106 is a resistance temperature detector (RTD) made of metal. Depending on the metal material used, the RTD has a predictable resistance versus temperature relationship. Therefore, by measuring a resistance of the RTD, a corresponding temperature of the RTD can be determined using the resistance versus temperature relationship. In accordance with some other embodiments, the gate structure 106 is a thermistor made of semiconductor material. Depending on the semiconductor material used, the thermistor also has a predictable resistance versus temperature relationship. Similar to the RTD, by measuring a resistance of the thermistor, a corresponding temperature of the thermistor can be determined using a resistance versus temperature relationship of the thermistor.

Figure 2:
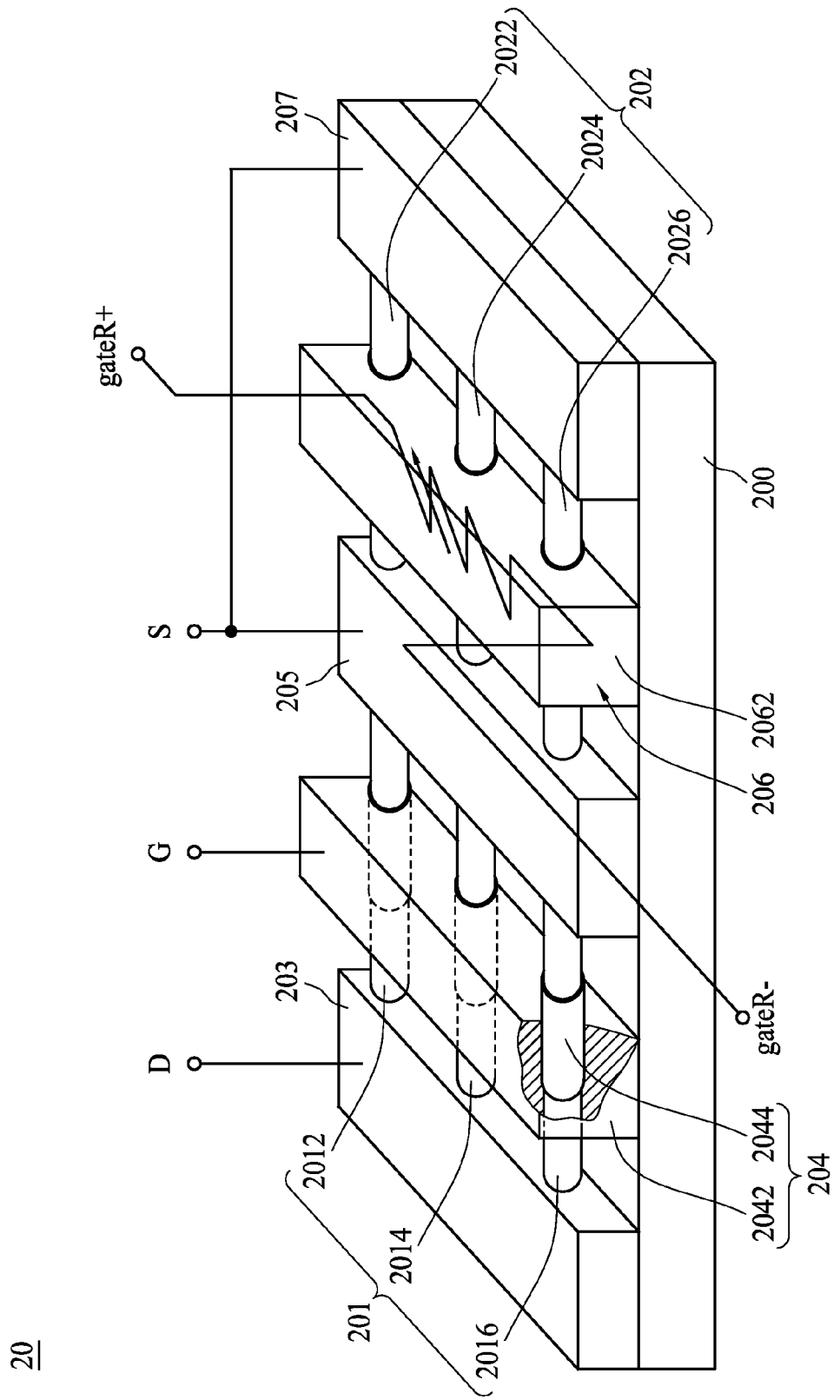
FIG. 2 is a schematic perspective diagram of a semiconductor device with a temperature detector in accordance with some embodiments.

FIG. 2 is a schematic perspective diagram of a semiconductor device 20 with a temperature detector in accordance with some embodiments. In an embodiment, the device 20 is a multi-finger nanowire FET device with an unconnected gate finger serving as the temperature detector. In another embodiment, the device 20 includes two abutted nanowire FETs with a gate of one of the nanowire FETs that has shorted source and drain serving as the temperature detector. Although the term "nanowire" is used to refer to a wire of a channel structure in the device 20, the wire with another dimension is within the contemplated scope of the present disclosure. The device 20 includes a substrate 200, channel structures 201 and 202, a gate stack 204 and a gate stack 206, drain structures 203 and 207, and a source structure 205. The substrate 200 is a silicon-on-insulator (SOI) substrate or a bulk substrate. The channel structure 201 includes nanowires 2012, 2014 and 2016, and the channel structure 202 includes nanowires 2022, 2024 and 2026. For simplicity, each channel structure 202 or 204 includes three nanowires in FIG. 2. However, an implementation with other number of nanowires is also within the contemplated scope of the present disclosure. The nanowire 2012, 2014, 2016, 2022, 2024 or 2026 has a circular periphery and are thus non-planar. The gate stack 204 includes a gate structure 2042 and a gate dielectric layer 2044. For illustration, the gate dielectric layer 2044 that wraps the nanowire 2016 is exposed from the dissected gate stack 204 for the gate dielectric layer 2044. However, the gate structure 2042 covers the gate dielectric layer 2044 that wraps the nanowire 2016, similar to the gate structure 2042 covering the gate dielectric layer 2044 that wraps the other nanowires 2012 and 2014. The gate stack 206 is similar to the gate stack 204 and includes a gate structure 2062 and a gate dielectric layer (not shown for simplicity). Alternatively, the gate stack 206 includes the gate structure 2062 but does not include the gate dielectric layer. The material of the gate stacks 204 and 206 is similar to that in FIG. 1.

The gate stack 204 traverses the channel structure 201. As the gate stack 204 interfaces with the wire 2012, 2014 or 2016, the gate structure 2042 surrounds the surface that form the circular periphery of the nanowire 2012, 2014 or 2016. The gate dielectric layer 2044 is inserted between the gate structure 2042 and the nanowire 2012, 2014 or 2016. The channel structure 201 on opposite sides of the gate stack 204 is coupled to the drain structure 203 and the source structure 205. The gate stack 204, the channel structure 201, the drain and source structures 203 and 205 form a first nanowire FET. The first nanowire FET provides a transistor function for the device 20, and the gate structure 2042, and the drain and source structures 203 and 205 serve as a gate G, a drain D and a source S of the device 20, respectively.

Similarly, the gate stack 206 traverses the channel structure 202. The channel structure 202 on opposite sides of the gate stack 206 is coupled to the source structure 205 and the drain structure 207. The gate stack 206, the channel structure 202, the drain and source structures 207 and 205 form a second nanowire FET. In an embodiment, the first nanowire FET and the second nanowire FET are two nanowire FETs that are abutted. The source structure 205 is shared between the first nanowire FET and the second nanowire FET, or the source structures of the first and second nanowire FETs are coupled. In another embodiment, the device 20 is a multi-finger FET device. For a multi-finger FET device, the terminals of the first nanowire FET and the second nanowire FET are coupled. For example, the gate structure 2042 is coupled to the gate structure 2062 and the gate structures 2042 and 2062 are referred to as gate fingers of the multi-finger FET device. Further, the drain structure 203 is coupled to the drain structure 207, and the source structure 205 is shared. In some embodiments, to form a temperature detector based on the second nanowire FET, the gate structure 2062 remains separated from the gate structure 2042 and the drain structure 207 and the source structure 205 are shorted together. The gate structure 2062 serves as the temperature detector for the first nanowire FET, has two resistance measuring terminals gateR+ and gateR− on the gate structure 2062, a resistance between the two resistance measuring terminals gateR+ and gateR−, and varies with temperature local to the channel structure 201, of the first nanowire FET. Therefore, by measuring a resistance across the two terminals gateR+ and gateR−, the temperature local to the first nanowire FET is detected. Effectively, a temperature local to the device 20 is detected.

The mechanism and operation for detecting local self heat of the first nanowire FET is similar to that in the embodiments with reference to FIG. 1 except that the fins in FIG. 1 are replaced by nanowires in FIG. 2 and the description thereof is therefore omitted.

Figure 3:
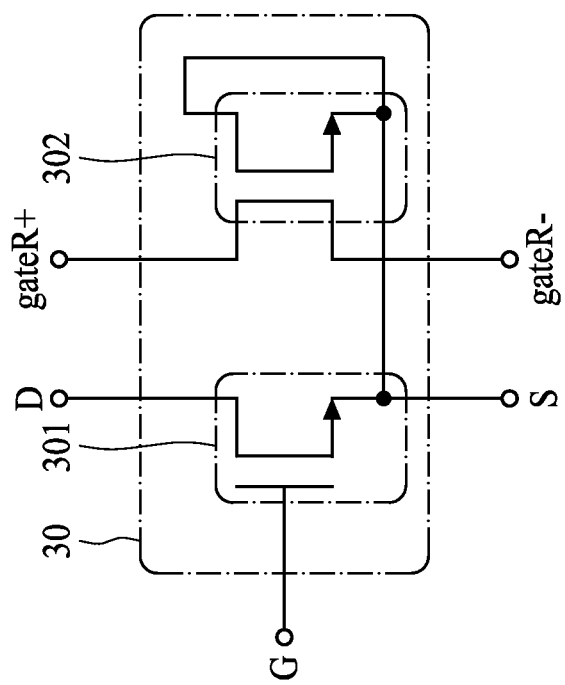
FIG. 3 is a schematic circuit diagram of an N channel semiconductor device with a temperature detector in accordance with some embodiments.

FIG. 3 is a schematic circuit diagram of an N channel semiconductor device 30 with a temperature detector in accordance with some embodiments. Because at the circuit level, the device 10 in FIG. 1 and the device 20 in FIG. 2 are the same, the device 30 represents both the device 10 and the device 20. The device 30 includes an N channel FET 301 corresponding to the first FinFET in FIG. 1 or the first nanowire FET in FIG. 2, and an N channel FET 302 corresponding to the second FinFET in FIG. 1 or the second nanowire FET in FIG. 2. The FET 301 provides the transistor function for the device 30. A gate, a source and a drain of the FET 301 serve as a gate G, a drain D and a source S of the device 30, respectively. A source and a drain of the FET 302 are shorted together and coupled to the source S of the device 30. A gate of the FET 302 is separated from the gate of the FET 301 and serves as the temperature detector for the FET 301. A resistance of the gate of the FET 302 between two terminals gateR+ and gateR− varies with temperature local to the FET 301. In some embodiments, the temperature local to the device 30 is measured by measuring a resistance between the two terminals gateR+ and gateR− of the device 30.

FIG. 4 is a schematic circuit diagram of a P channel semiconductor device 40 with a temperature detector in accordance with some embodiments. Compared with device 30 in FIG. 3, the N channel FETs 301 and 302 in FIG. 3 are replaced by P channel FETs 401 and 402. As a result, configurations of FETs 401 and 402 are changed accordingly. For example, the shorted source and drain of the FET 402 are tied to a drain of the FET 401, which also serves as a drain D of the device 40.

Figure 5:
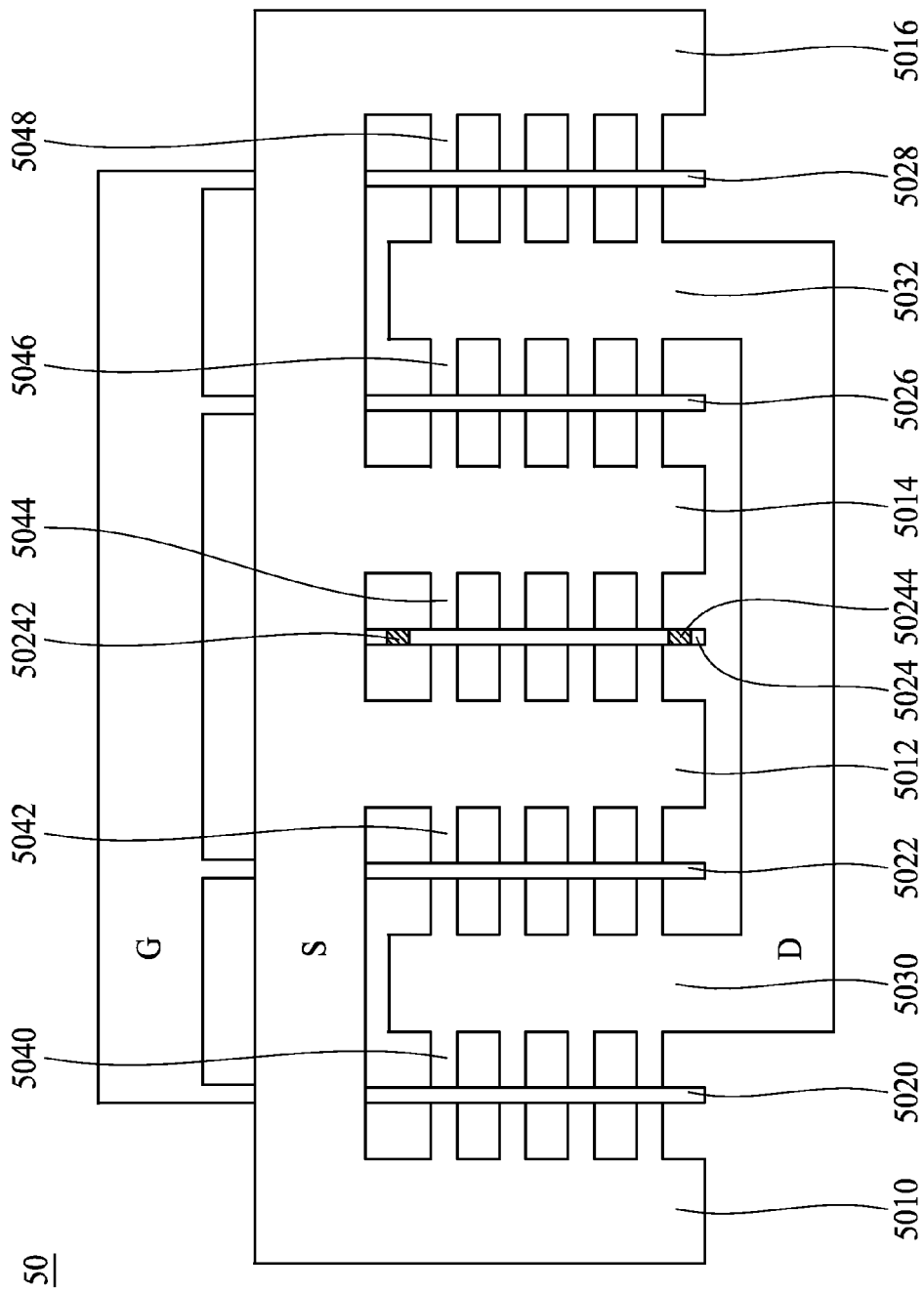
FIG. 5 is a schematic top view diagram of a multi-finger semiconductor device with a temperature detector in accordance with some embodiments.

FIG. 5 is a schematic top view diagram of a multi-finger semiconductor device 50 with a temperature detector. The device 50 has an unconnected gate finger serving as the temperature detector, and is symmetric with respect to the temperature detector. Although the embodiments described below with reference to FIG. 5 are based on a multi-finger device, the present disclosure is not limited to forming the temperature detector in the multi-finger device. The temperature detector can also be a gate of a dummy transistor abutted with the transistor for which a temperature is detected, as described for the embodiments with reference to FIG. 1 and FIG. 2. The device 50 includes gate fingers 5020, 5022, 5024, 5026 and 5028. With respect to the gate fingers 5020, 5022, 5024, 5026 and 5028, channel structures 5040, 5042, 5044, 5046 and 5048 are disposed correspondingly. The channel structure 5040, 5042, 5046 or 5048 on opposite sides of the gate finger 5020, 5022, 5026 and 5028 are coupled to a source structure 5010, 5012, 5014 or 5016, and a drain structure 5030, 5030, 5032 or 5032. The gate fingers 5020, 5022, 5026 and 5028 are coupled together to form a gate G of the device 50. The source structures 5010, 5012, 5014 and 5016 are coupled together to form a source S of the device 50. The drain structures 5030 and 5032 are coupled together to form a drain D of the device 50. The gate finger 5024 is not connected to the gate G of the device 50. The channel structure 5044 on opposite sides of the gate finger 5024 are coupled to the source structures 5012 and 5014 corresponding to gate fingers 5022 and 5026. In some embodiments, a drain structure and a source structure are essentially the same, the coupled source structures 5012 and 5014 corresponding to gate fingers 5022 and 5026, respectively, are equivalent to the shorted source and drain structures corresponding to the gate finger 5024 being coupled to the source S of the device 50. A resistance between two terminals 50242 and 50244 on the gate finger 5024 varies with temperature local to each of the channel structure 5040, 5042, 5046 or 5048 and serves as the temperature detector of the device 50. The device 50 is symmetric with respect to the unconnected gate finger 5024. The source and drain arrangements on both sides of the gate finger 5024 starts from the source structure 5012 or 5014 closest to the gate finger 5024, to the drain structure 5030 or 5032, and then to the source structure 5010 or 5016 furthest to the gate finger 5024.

The device 50 in FIG. 5 is an N channel device and therefore the shorted source and drain structures corresponding to the gate finger 5024 are coupled to the source S of the device 50. The structure of a P channel device is similar to that of the N channel device except the doping type of each structure is changed correspondingly and the shorted source and drain structures corresponding to the gate finger 5024 are coupled to the drain D, instead to the source S of the device 50.

Figure 6:
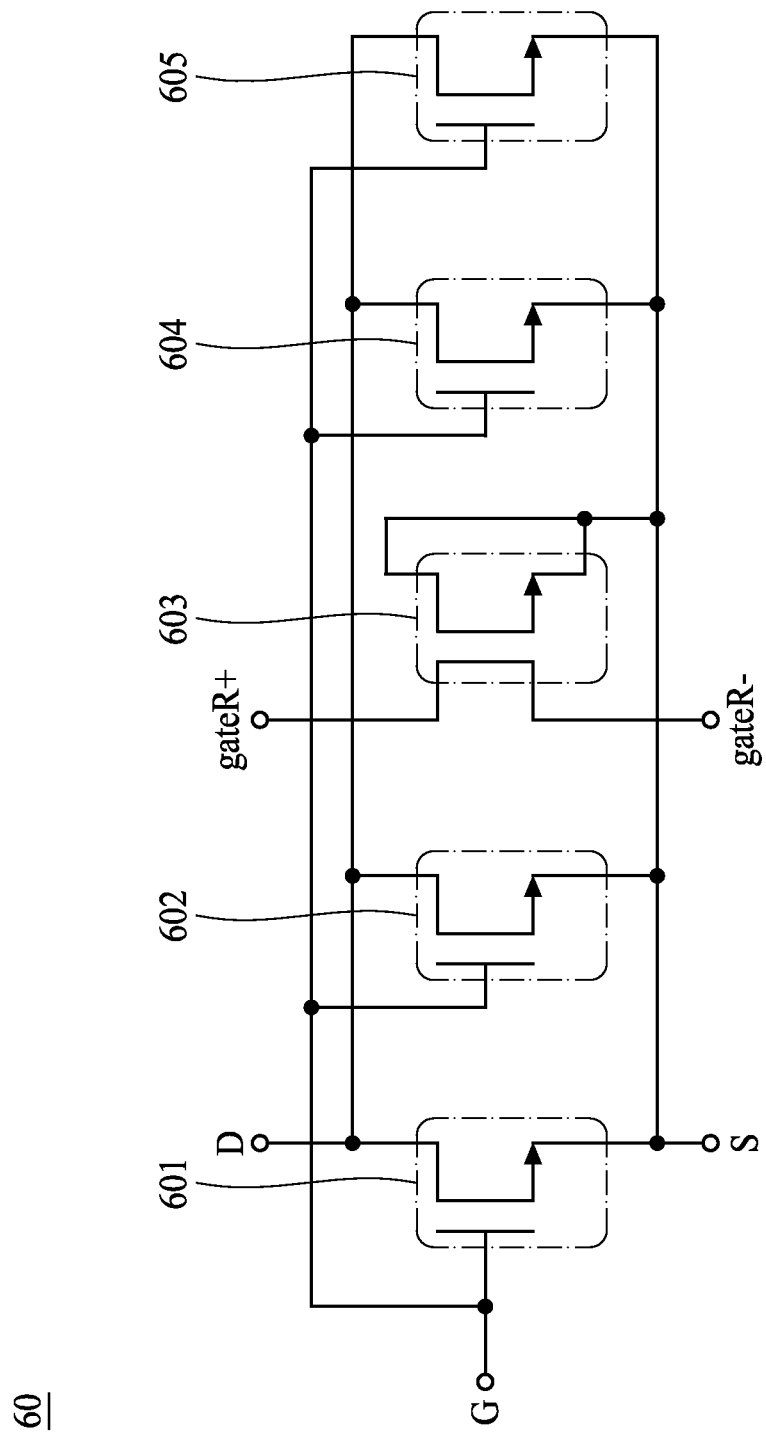
FIG. 6 is a schematic circuit diagram of an N channel multi-finger semiconductor device with a temperature detector in accordance with some embodiments.

FIG. 6 is a schematic circuit diagram of an N channel multi-finger semiconductor device 60 with a temperature detector in accordance with some embodiments. The device 60 represents the multi-finger semiconductor device 50 in FIG. 5 at the circuit level. The device 60 includes N channel FETs 601, 602, 603, 604, and 605, corresponding to the FET structures associated with the gate fingers 5020, 5022, 5024, 5026 and 5028 in FIG. 5, respectively. Gates, sources and drains of the FETs 601, 602, 604 and 605 are coupled together to serve as a gate G, a source S and a drain D of the device 60, respectively. A source and a drain of the FET 603 are shorted together and coupled to the source S of the device 60. A gate of the FET 603 is not connected to the gate G of the device 60 and serves as the temperature detector for the FETs 601, 602, 604 and 605. A resistance of the gate of the FET 603 between two terminals gate R+ and gateR− on the gate of the FET 603 varies with temperature local to the FETs 601, 602, 604 and 605. Effectively, the temperature local to the device 60 is measured from the two terminals gateR+ and gateR− of the device 60.

Figure 7:
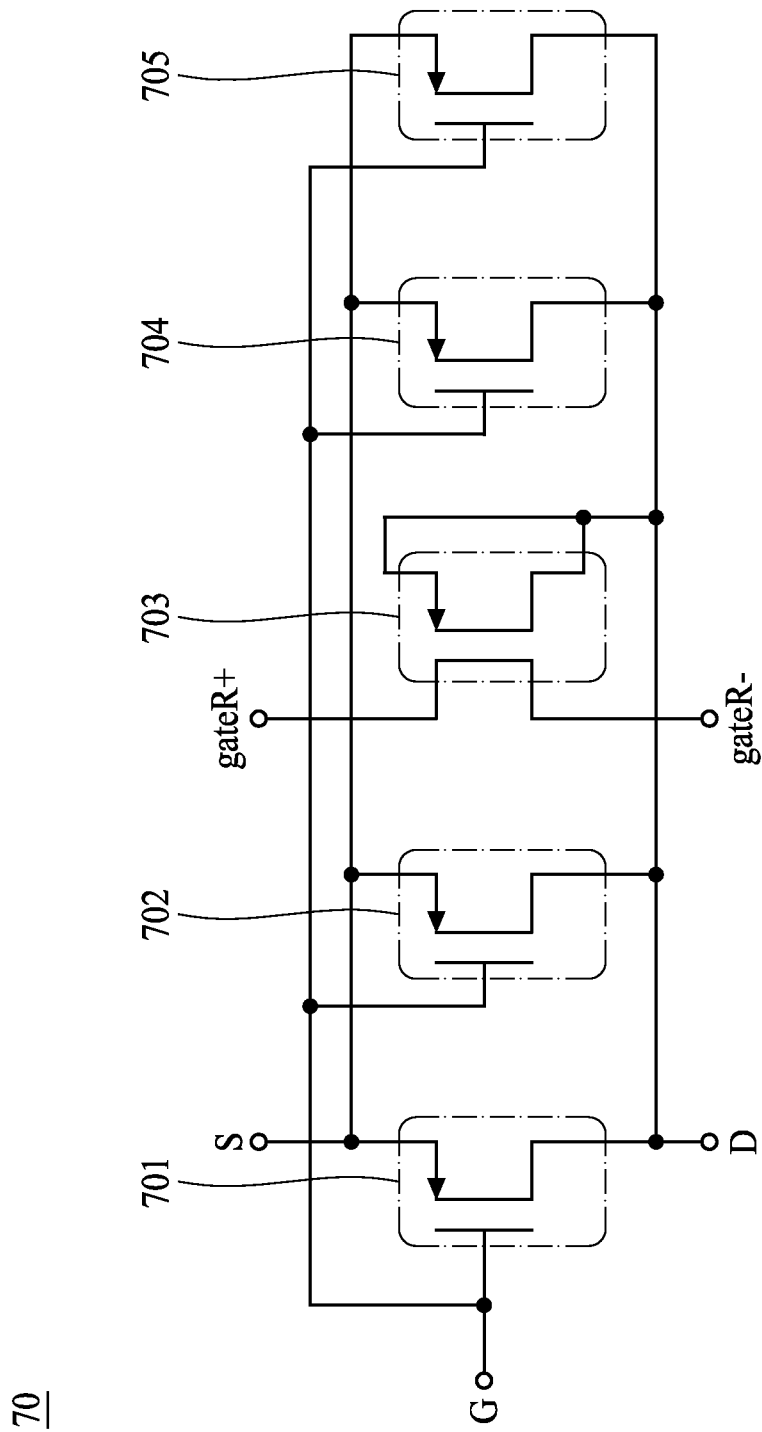
FIG. 7 is a schematic circuit diagram of a P channel multi-finger semiconductor device with a temperature detector in accordance with some embodiments.

FIG. 7 is a schematic circuit diagram of a P channel multi-finger semiconductor device 70 with a temperature detector in accordance with some embodiments. Compared with the device 60 in FIG. 6, the N channel FETs 601 to 605 in FIG. 6 are replaced by P channel FETs 701 to 705. As a result, the P channel FETs 701 to 705 are configured accordingly. For example, the shorted source and drain of the FET 703 are tied to a drain D of the device 70.

MOS Array with Temperature Detector

Figure 8:
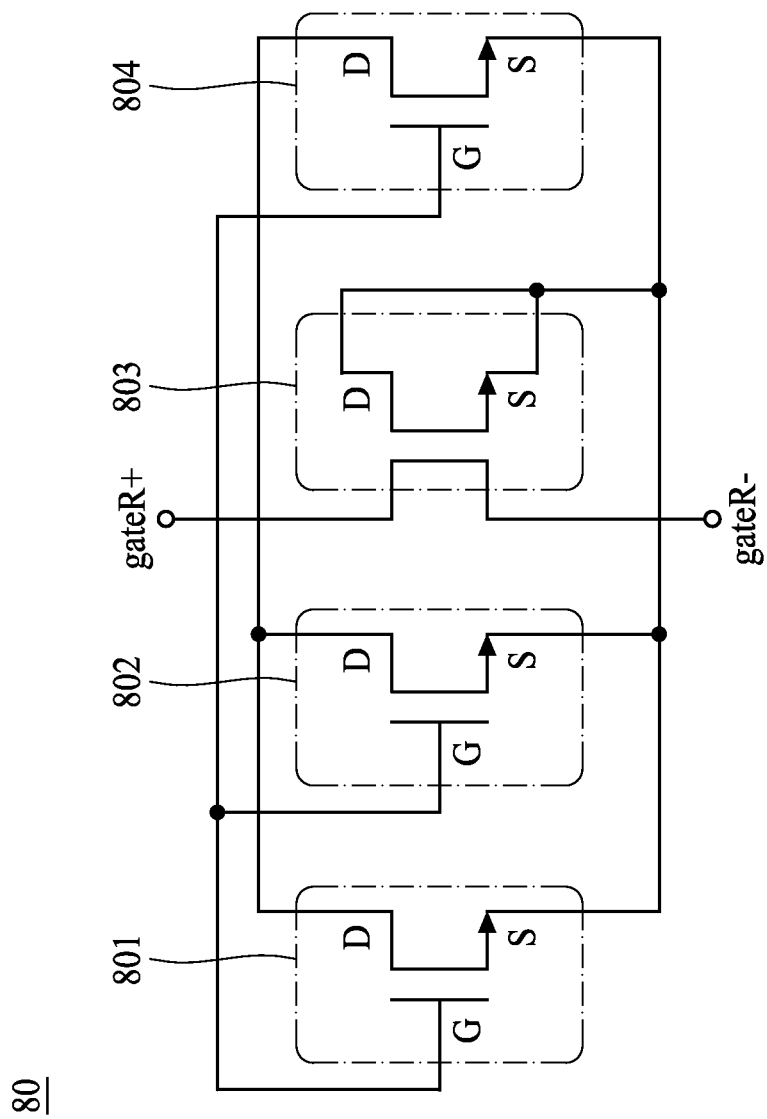
FIG. 8 is a schematic circuit diagram of an NMOS array with a temperature detector in accordance with some embodiments.

FIG. 8 is a schematic circuit diagram of an NMOS array 80 with a temperature detector in accordance with some embodiments. The NMOS array 80 includes NMOSs 801, 802 and 804 and a dummy NMOS 803. The NMOSs 801, 802 and 804 are connected in parallel. Gates G, drains D and sources S of the NMOSs 801, 802 and 804 are coupled together. The dummy NMOS 803 has an unconnected gate, and shorted source S and drain D coupled to the sources S of the NMOSs 801, 802 and 804. The gate of the dummy NMOS 803 is in close proximity to the NMOSs 801, 802 and 804. In accordance with some embodiments, distances between the gate of the dummy NMOS 803 to the gates G of the NMOSs 801, 802 and 804, respectively, are less than about 0.5 μm. Therefore, a resistance between two resistance measuring terminals gateR+ and gateR− on the gate of the dummy NMOS 803 varies with a temperature local to channel structures of the NMOSs 801, 802, 804. For illustration purpose, the number of parallel-connected NMOSs in the NMOS array 80 in FIG. 8 is four. However, the number of parallel-connected NMOSs in an NMOS array can be another number as long as each of the NMOS is within 0.5 μm of the dummy NMOS. The manner with which heat local to the NMOS array 80 is being detected is similar to that described for the semiconductor devices with a temperature detector with references to FIGS. 1 to 7.

Figure 9:
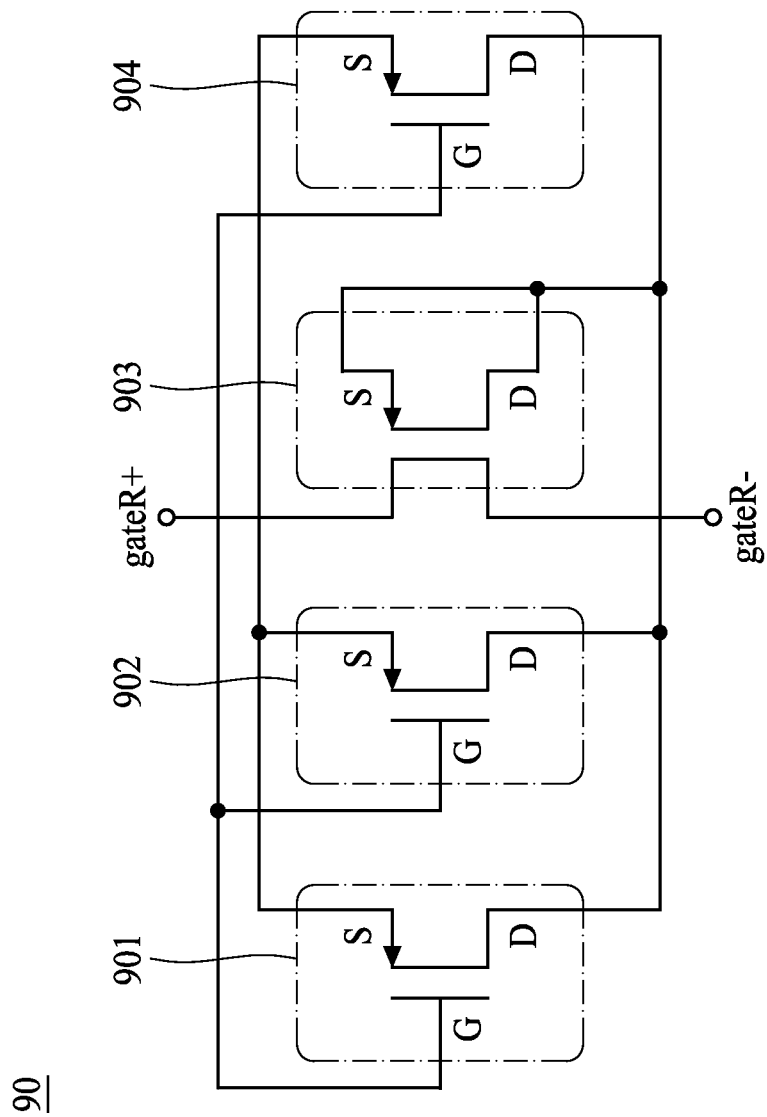
FIG. 9 is a schematic circuit diagram of a PMOS array with a temperature detector in accordance with some embodiments.

FIG. 9 is a schematic diagram of a PMOS array 90. Compared with the NMOS array 80 in FIG. 8, the PMOSs 901, 902 and 904 replace the NMOSs 801, 802 and 804, and a dummy PMOS 903 replaces the dummy NMOS 803. As a result, the PMOSs 901, 902 and 904, and the dummy PMOS are configured accordingly. For example, the shorted source S and drain D of the dummy PMOS 903 are tied to drains D of the PMOS s 901, 902 and 904.

System for Controlling Heat of Circuit with Temperature Detector

Figure 10:
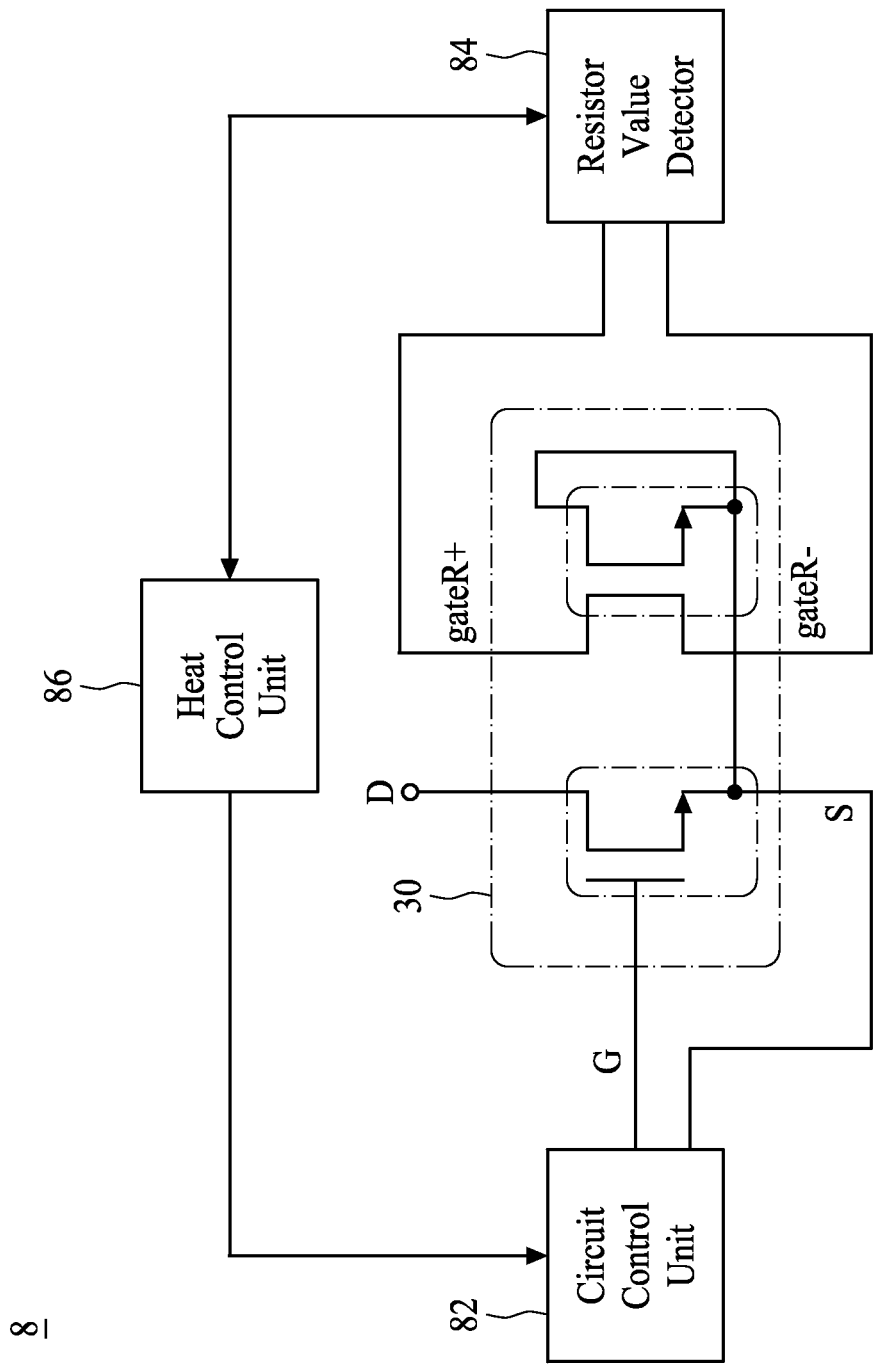
FIG. 10 is a block diagram of a system for controlling heat of a semiconductor device with a temperature detector in accordance with some embodiments.

FIG. 10 is a block diagram of a system 8 for controlling heat of a semiconductor device 30 with a temperature detector. The system 8 includes the device 30, a circuit control unit 82, a resistor value detector 84 and a heat control unit 86. For illustration, the device 30 in FIG. 10 is the device 30 in FIG. 3. However, the device 30 can be any of the devices 10 to 70 in FIGS. 1 to 7 or the circuits 80 and 90 in FIGS. 8 to 9. The circuit control unit 82 is coupled to the gate G and source S of the device 30, and is configured to control the device 30 to turn on or off. The resistor value detector 84 is coupled to the two terminals gateR+ and gateR− of the device 30 and is configured to measure a resistance across the two terminals gateR+ and gateR−. The heat control unit 86 is coupled to the circuit control unit 82 and the resistor value detector 84. The heat control unit 86 is configured to control the circuit control unit 82 to turn on and off the circuit control unit, control the resistor value detector 84 to measure resistance values correspondingly, and based on the measured resistance values, determine if self-heat of the device 30 exceeds a predetermined limit and control the circuit control unit 82 to adjust a time the device 30 is turned on, or turn off the device 30 if needed.

In the below illustration, unless with reference to FIG. 11 and FIG. 12, unless otherwise indicated, the heat control unit 86 controls the resistor value detector 84 and the circuit control unit 82 to perform corresponding functions.

Figure 11:
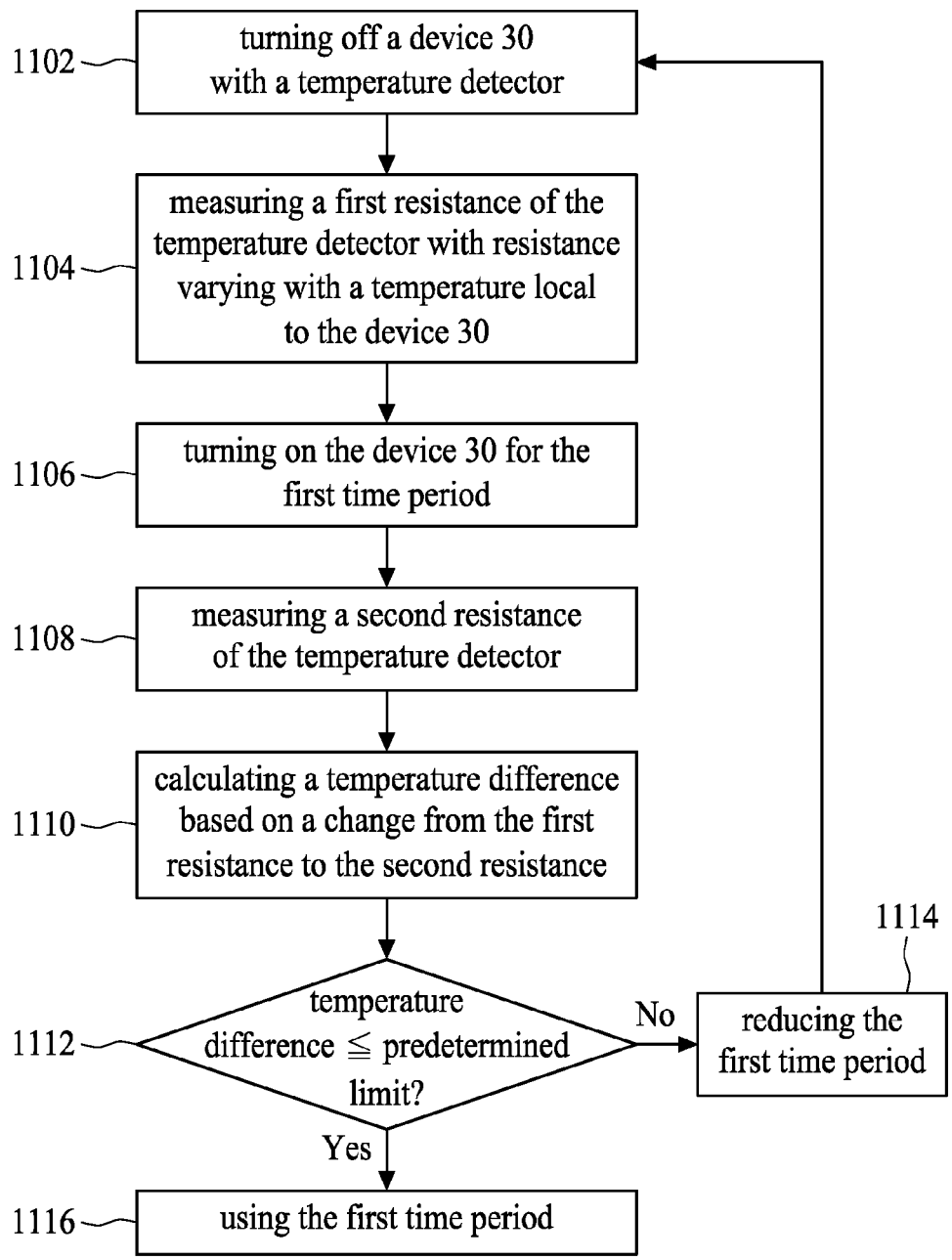
FIG. 11 is a flow chart of a method for controlling heat of a semiconductor device with a temperature detector in accordance with some embodiments.

FIG. 11 is a flow chart 1100 of a method for controlling heat of a semiconductor device with a temperature detector in accordance with some embodiments. The method is performed by the system 8 in FIG. 10.

In operation 1102, the circuit control unit 82 turns off the device 30 through the gate G and source S of the device 30.

In operation 1104, the resistor value detector 84 measures a first resistance of the temperature detector with resistance varying with a temperature local to the device 30 and obtains the first resistance from the resistor value detector 84.

In operation 1106, the circuit control unit 82 turns on the device 30 for a first time period. In operation 1108, the resistor value detector 84 measures a second resistance of the temperature detector and obtains the second resistance from the resistor value detector 84.

In operation 1110, the heat control unit 86 calculates a temperature difference based on a change from the first resistance to the second resistance. The temperatures of the temperature detector, in some embodiments, are obtained from a predetermined resistance versus temperature relationship of the temperature detector.

In operation 1112, whether the temperature difference is within a predetermined limit is determined. In accordance with some embodiments, the predetermined limit is based on a mean time to failure of metal associated with the device 30 due to electromigration. The metal is a metal gate, metal contacts or metal interconnects associated with the device 30. The mean time to failure is determined based on the Black's equation.

If the temperature difference is not within the predetermined limit, the first time period is reduced in operation 1114. In some embodiments, if the device 30 is turned off, the first time period is reduced to zero. After operation 1114, the method loops back to operation 1102 to determine if a temperature difference corresponding to the new first time period is within the predetermined limit. If the temperature difference is within the predetermined limit, the current first time period is used in operation 1116.

In accordance with some embodiments, the first time period in the operation 1106 is set to be a maximum value known to cause the temperature difference exceeding the predetermined limit initially and is reduced in iterations.

The temperature detectors of the present disclosure are not limited to enhancing electromigration reliability as illustrated with reference to FIG. 11. Other applications are within the contemplated scope of the present disclosure, including, for example, slowing down aging of the device 30 with the predetermined limit specified for an aging requirement.

Figure 12:
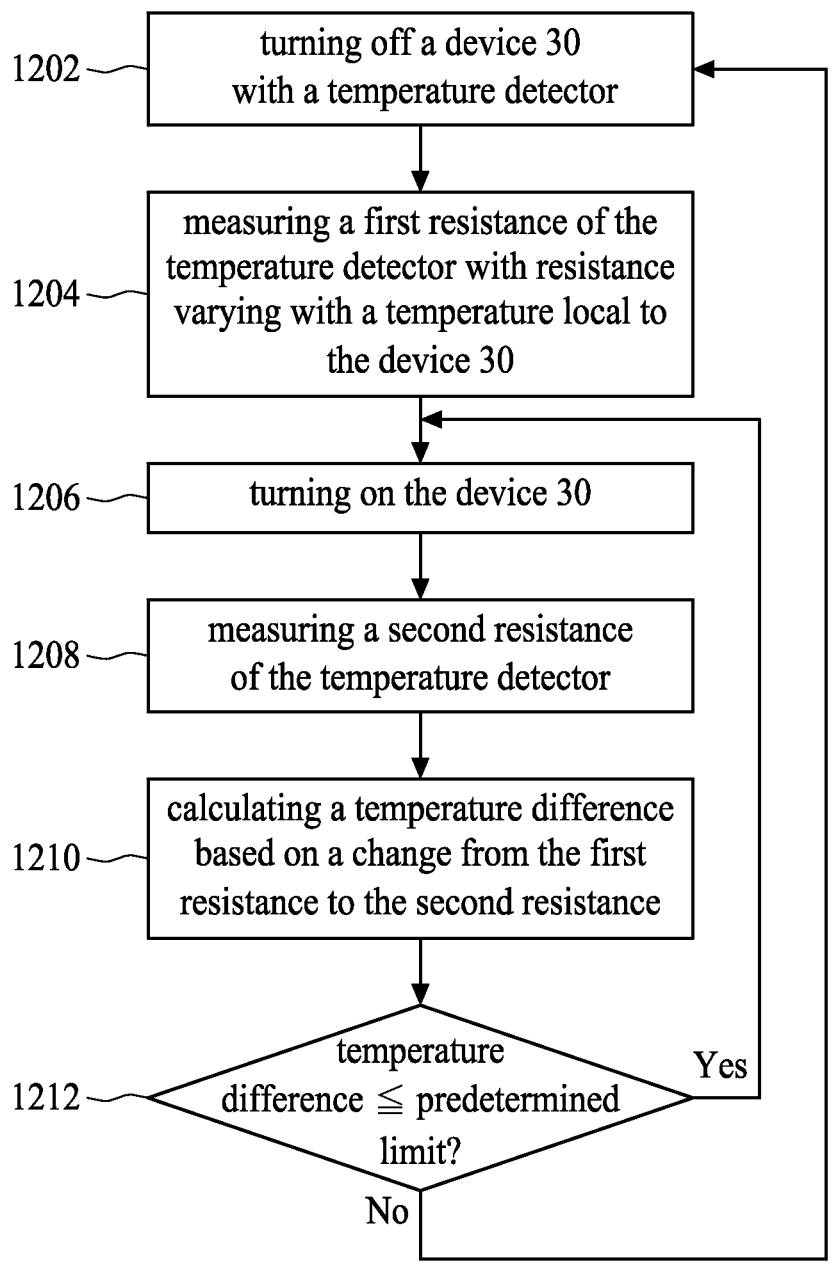
FIG. 12 is a flow chart of a method for controlling heat of a semiconductor device with a temperature detector in accordance with some embodiments.

FIG. 12 is a flow chart 1200 of a method for controlling heat of a semiconductor device with a temperature detector in accordance with some embodiments. The method is performed by the system 8 in FIG. 10. Compared to the method in FIG. 11 that finds a fixed time period that the device 30 is turned on without exceeding a temperature range safe for electromigration reliability, the method in FIG. 12 turns on or off the device 30 using feedback control.

In operation 1202, the circuit control unit 82 turns off the device 30 through the gate G and source S of the device 30.

In operation 1204, the resistor value detector 84 measures a first resistance of the temperature detector with resistance varying with a temperature local to the device 30 and obtains the first resistance from the resistor value detector 84.

In operation 1206, the circuit control unit 82 turns on the device 30.

In operation 1208, the resistor value detector 84 measures a second resistance of the temperature detector and obtains the second resistance from the resistor value detector 84.

In operation 1210, the heat control unit 86 calculates a temperature difference based on a change from the first resistance to the second resistance.

In operation 1212, whether the temperature difference is within a predetermined limit is determined. Similar to operation 1112 in FIG. 11, the predetermined limit can be specified based on an electromigration reliability requirement or an aging requirement, for example.

If the temperature difference is not within the predetermined limit, the method loops back to operation 1202 to turn off the device 30. In accordance with some embodiments, after the device 30 is turned off, the device 30 is cooled down. Effectively, the temperature of the device 30 decreases, and the resistance of the temperature detector changes accordingly. The method then continues with operation 1204.

In contrast, if the temperature difference is within the predetermined limit, the method loops back to operation 1206 so that the device 30 remains turned on.

In some embodiments of the present disclosure, the area of a temperature sensor is reduced by using a gate of a dummy transistor in close proximity of less than 0.5 µm to a transistor for measuring temperature local to the transistor, or by using an unconnected gate finger of a multi-finger device for measuring temperature local to the multi-finger device. Therefore, temperature local to a circuit can be detected and used for preventing heat from degrading electromigration reliability, for example.

In some embodiments, a circuit comprises a substrate, first and second channel structures, first and second gate stacks, first source and first drain structures, and second source and second drain structures. The first and second channel structures are disposed on the substrate. Each of the first and second channel structures has a non-planar structure. The first and second gate stacks traverse the first and second channel structures, respectively. The first gate stack comprises a first gate dielectric layer and a first gate structure disposed on the first gate dielectric layer. The second gate stack comprises a second gate structure. The first source and first drain structures are coupled to the first channel structure on opposite sides of the first gate stack. The second source and second drain structures are coupled to the second channel structure on opposite sides of the second gate stack. One of the first source and first drain structures is coupled to one of the second source and second drain structures. The second source and second drain structures are shorted together. The first and second gate structures are separated from one another. A resistance between two resistance measuring terminals on the second gate structure varies with temperature local to the device.

In some embodiments, a circuit comprises a first FET and a second FET. The first and second FETs have non-planar channel structures. One of a source and a drain of the first FET is coupled to one of a source and a drain of the second FET. A gate of the second FET is separated from a gate of the first FET. The source and the drain of the second FET are shorted together. A resistance between two resistance measuring terminals on the gate of the second FET varies with a temperature local to the first FET.

In some embodiments, a system comprises a first circuit, a circuit control unit, a resistor value detector, and a heat control unit. The first circuit comprises a first FET and a second FET. The first and second FETs have non-planar channel structures. One of a source and a drain of the first FET is coupled to one of a source and a drain of the second FET. A gate of the second FET is separated from a gate of the first FET. The source and the drain of the second FET are shorted together. A resistance between two resistance measuring terminals on the gate of the second FET varies with a temperature local to the first FET. The circuit control unit is coupled to the gate and the source of the first FET, and is configured to control the first FET to turn on or off. The resistor value detector is coupled to the two resistance measuring terminals of the second FET, and is configured to measure a resistance across the two resistance measuring terminals. The heat control unit is coupled to the circuit control unit and the resistance value detector, and is configured to control heat of the first circuit based on a change in measured resistances when the first FET is turned on or off.

A number of embodiments of the disclosure have been described. It will nevertheless be understood that various modifications may be made without departing from the spirit and scope of the disclosure. For example, some transistors are shown to be N-type and some others are shown to be P-type, but the disclosure is not limited to such a configuration. Embodiments of the disclosure are applicable in variations and/or combinations of transistor types.

The above description includes exemplary operations, but these operations are not necessarily required to be performed in the order shown. Operations may be added, replaced, changed order, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:
1. A circuit comprising:
a substrate;

first and second channel structures disposed on the substrate, wherein each of the first and second channel structures has a non-planar structure;

first and second gate stacks traversing the first and second channel structures, respectively, wherein the first gate stack comprises a first gate dielectric layer and a first gate structure disposed on the first gate dielectric layer, and the second gate stack comprises a second gate structure;

first source and first drain structures coupled to the first channel structure on opposite sides of the first gate stack; and second source and second drain structures coupled to the second channel structure on opposite sides of the second gate stack, wherein one of the first source and first drain structures is coupled to one of the second source and second drain structures;

the second source and second drain structures are shorted together;

the first and second gate structures are separated from one another; and a resistance between two resistance measuring terminals on the second gate structure varies with temperature local to the circuit.

2. The circuit according to claim 1, wherein a distance between the first gate structure and the second gate structure is smaller than about 0.5 μm.

3. The circuit according to claim 1, wherein the first and second source and drain structures are N-type, and the shorted second source and second drain structures are coupled to the first source structure.

4. The circuit according to claim 1, wherein the first and second source and drain structures are P-type, and the shorted second source and second drain structures are coupled to the first drain structure.

5. The circuit according to claim 1, wherein one of the first source and first drain structures is shared with one of the second source and second drain structures.

6. The circuit according to claim 5, further comprising:
a third channel structure disposed on the substrate, wherein the third channel structure has a non-planar structure;
a third gate stack traversing the third channel structure, wherein the third gate stack comprises a third gate dielectric layer and a third gate structure disposed on the third gate dielectric layer; and
third source and third drain structures coupled to the third channel structure on opposite sides of the third gate stack,
wherein
the third gate structure is coupled to the first gate structure;
the third source and third drain structures are coupled to the first source and first drain structures, respectively; and
the first source or first drain structure is shared with the second source or second drain structure, and the third source or third drain structure is shared with the second drain or second source structure.

7. The circuit according to claim 1, wherein the circuit is a FinFET circuit;
each of the first and second channel structures comprises at least one fin; and
the two resistance measuring terminals of the second gate structure are located across the at least one fin of the second channel structure, or along one of the at least one fin of the second channel structure.

8. The circuit according to claim 1, wherein the circuit is a nanowire FET circuit;
each of the first and second channel structures comprises at least one nanowire; and
the two resistance measuring terminals of the second gate structure are located across the at least one nanowire, or along one of the at least one nanowire of the second channel structure.

9. The circuit according to claim 1, wherein the circuit is a multi-finger device;
the first gate structure, the first source and first drain structures form a gate, a source and a drain of the multi-finger device; and
the second gate structure is not connected to the gate of the multi-finger device.

10. A circuit, comprising:
a first FET; and
a second FET,
wherein
the first and second FETs have non-planar channel structures;
one of a source and a drain of the first FET is coupled to one of a source and a drain of the second FET;
a gate of the second FET is separated from a gate of the first FET;
the source and the drain of the second FET are shorted together; and
a resistance between two resistance measuring terminals on the gate of the second FET varies with a temperature local to the first FET.

11. The circuit according to claim 10, wherein a distance between the gate of the first FET and the gate of the second FET is smaller than about 0.5 μm.

12. The circuit according to claim 10, wherein the first FET is an N channel FET, and the shorted source and drain of the second FET are coupled to the source of the first FET.

13. The circuit according to claim 10, wherein the first FET is a P channel FET, and the shorted source and drain of the second FET are coupled to the drain of the first FET.

14. The circuit according to claim 10, further comprising:
a third FET,
wherein
the third FET has a non-planar channel structure;
a source and a drain of the third FET are coupled to the source and the drain of the first FET, respectively; and
the source or drain of the first FET is shared with the source or drain of the second FET and the source or drain of the third FET is shared with the drain or source of the third FET.

15. The circuit according to claim 10, wherein the first and second FETs are FinFETs; and
the two resistance measuring terminals of the gate of the second FET are located across at least one fin of the second FET, or along one of the at least one fin of the second FET.

16. The circuit according to claim 10, wherein the first and second FETs are nanowire FETs; and
the two resistance measuring terminals of the gate of the second FET are located across at least one nanowire of the second FET, or along one of the at least one nanowire the second FET.

17. The circuit according to claim 10, wherein the circuit is a multi-finger device;

the gate, the source and the drain of the first FET form a gate, a source and a drain of the multi-finger device; and the gate of the second FET is not connected to the gate of the multi-finger device.

18. A circuit comprising:

a substrate;

first and second channel structures disposed on the substrate, wherein each of the first and second channel structures has a non-planar structure;

first and second gate stacks traversing the first and second channel structures, respectively, wherein the first gate stack comprises a first gate dielectric layer and a first gate structure disposed on the first gate dielectric layer, and the second gate stack comprises a second gate structure; and first source and first drain structures coupled to the first channel structure on opposite sides of the first gate stack, wherein one of the first source and first drain structures is coupled to a first portion of the second channel structure on a first side of the second gate stack;

the first portion of the second channel structure and a second portion of the second channel structure on a second side of the second gate stack opposite to the first side are shorted together;

the first and second gate structures are separated from one another; and a resistance between two resistance measuring terminals on the second gate structure varies with temperature local to the circuit.

19. The circuit according to claim 18, wherein a distance between the first gate structure and the second gate structure is smaller than about 0.5 µm.

20. The circuit according to claim 18, wherein the circuit is a FinFET circuit;

each of the first and second channel structures comprises at least one fin; and the two resistance measuring terminals of the second gate structure are located across the at least one fin of the second channel structure, or along one of the at least one fin of the second channel structure.

\* \* \* \* \*